United States Patent
Dornel et al.

(10) Patent No.: US 10,153,399 B2
(45) Date of Patent: Dec. 11, 2018

(54) OPTOELECTRONIC DEVICE COMPRISING SEMICONDUCTOR ELEMENTS AND ITS FABRICATION PROCESS

(71) Applicant: Aledia, Grenoble (FR)

(72) Inventors: Erwan Dornel, Fontaine (FR); Benoît Amstatt, Grenoble (FR); Philippe Gilet, Teche (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/108,738

(22) PCT Filed: Dec. 23, 2014

(86) PCT No.: PCT/EP2014/079276
§ 371 (c)(1),
(2) Date: Jun. 28, 2016

(87) PCT Pub. No.: WO2015/101578
PCT Pub. Date: Jul. 9, 2015

(65) Prior Publication Data
US 2016/0322536 A1    Nov. 3, 2016

(30) Foreign Application Priority Data

Dec. 30, 2013  (FR) ...................... 13 63700

(51) Int. Cl.
*H01L 33/24*  (2010.01)
*H01L 33/00*  (2010.01)
(Continued)

(52) U.S. Cl.
CPC .......... *H01L 33/24* (2013.01); *H01L 33/005* (2013.01); *H01L 33/0075* (2013.01);
(Continued)

(58) Field of Classification Search
CPC ... H01L 33/24; H01L 33/005; H01L 33/0075; H01L 33/18
(Continued)

(56) References Cited

U.S. PATENT DOCUMENTS

| 8,039,854 B2 | 10/2011 | Hersee et al. |
| 2006/0284187 A1 * | 12/2006 | Wierer, Jr. ............. B82Y 20/00 257/79 |

(Continued)

OTHER PUBLICATIONS

International Search Report, dated Mar. 25, 2015, from corresponding International Application No. PCT/EP2014/079276.
(Continued)

*Primary Examiner* — Mohsen Ahmadi
*Assistant Examiner* — Patricia Reddington
(74) *Attorney, Agent, or Firm* — Wolf, Greenfield & Sacks, P.C.

(57) ABSTRACT

An optoelectronic device including semiconductor elements, each semiconductor element resting on a carrier through an aperture formed in a portion at least one first part of which is insulating and covers at least partially the carrier, the height of the aperture being larger than or equal to 100 nm and smaller than or equal to 3000 nm and the ratio of the height to the smallest diameter of the aperture being higher than or equal to 0.5 and lower than or equal to 10.

22 Claims, 7 Drawing Sheets

(51) Int. Cl.
*H01L 33/18* (2010.01)
*H01L 29/06* (2006.01)
*H01L 21/02* (2006.01)

(52) U.S. Cl.
CPC ........ *H01L 33/18* (2013.01); *H01L 21/02639* (2013.01); *H01L 29/0665* (2013.01)

(58) Field of Classification Search
USPC .......................................................... 257/76
See application file for complete search history.

(56) References Cited

U.S. PATENT DOCUMENTS

| | | |
|---|---|---|
| 2011/0079766 A1 | 4/2011 | Wildeson et al. |
| 2011/0143472 A1 | 6/2011 | Seifert et al. |
| 2011/0310920 A1* | 12/2011 | Lee ................. B82Y 10/00 372/45.01 |
| 2012/0211727 A1* | 8/2012 | Ohlsson ............ B82Y 10/00 257/29 |
| 2013/0256689 A1* | 10/2013 | Pougeoise ........ H01L 31/02240 257/76 |

OTHER PUBLICATIONS

Written Opinion, dated Mar. 25, 2015, from corresponding International Application No. PCT/EP2014/079276.

\* cited by examiner

OPTOELECTRONIC DEVICE COMPRISING SEMICONDUCTOR ELEMENTS AND ITS FABRICATION PROCESS

CROSS-REFERENCE TO RELATED APPLICATIONS

This application is the national phase of International Application No. PCT/EP2014/079276, filed on Dec. 23, 2014, which claims priority to French patent application 13/63700, filed on Dec 30, 2013, both of which applications are hereby incorporated by reference to the maximum extent allowable by law.

BACKGROUND

The present invention generally relates to optoelectronic devices based on semiconductor materials and to methods of manufacturing the same. The present invention more particularly relates to optoelectronic devices comprising micrometer-range or nanometer-range semiconductor elements, particularly semiconductor microwires, nanowires, or structures having a pyramidal shape.

DISCUSSION OF THE RELATED ART

Micrometer- or nanometer-range semiconductor elements, particularly microwires, nanowires, or structures of pyramidal shape comprising a semiconductor material mainly comprising at least one group-III element and one group-V element (for example, gallium nitride GaN), called III-V compound hereafter, enable to manufacture semiconductor devices such as optoelectronic devices. Term "optoelectronic devices" is used to designate devices capable of converting an electric signal into an electromagnetic radiation or the other way, and especially devices dedicated to the detection, the measurement, or the emission of an electromagnetic radiation or devices dedicated to photovoltaic applications.

Methods of manufacturing micrometer- or nanometer-range semiconductor elements comprising a III-V compound should enable to manufacture such semiconductor elements with an accurate and uniform control of the geometry, of the position, and of the crystallographic properties of each semiconductor element.

The manufacturing of an optoelectronic device comprising micrometer- or nanometer-range semiconductor elements generally comprises forming seeds on a layer of a material favoring the forming of seeds of the III-V compound, called nucleation layer, the growth of the semiconductor elements from the seeds and the forming of an active layer on each semiconductor element. To control the locations where the semiconductor elements grow, the nucleation layer is for example covered with an insulating layer having openings exposing portions of the nucleation layer formed therein.

It is desirable to have only one seed form on the nucleation layer in each opening. However, a plurality of seeds may form in a same opening. This may cause the growth of a plurality of semiconductor elements from a same opening. A poor control of the growth of such semiconductor element is then obtained, particularly as concerns the height and the orientation of each semiconductor element. This may result in a degradation of the operation of the optoelectronic device.

SUMMARY

Thus, an object of an embodiment is to at least partly overcome the disadvantages of the previously-described methods of manufacturing optoelectronic devices comprising micrometer- or nanometer-range semiconductor elements, particularly semiconductor microwires, nanowires, or structures of pyramidal shape and of the methods of manufacturing the same.

Another object of an embodiment is to obtain the growth of a single semiconductor element from each opening of the insulating layer covering the seed layer.

Another object of an embodiment is to control the orientation of the semiconductor element growing from each opening of the insulating layer covering the seed layer.

Another embodiment of the present invention provides the possibility of accurately and uniformly controlling the position, the geometry, and the crystallographic properties of each III-V compound semiconductor element.

Another object of an embodiment is for optoelectronic devices comprising nanometer- or micrometer-range semiconductor elements to be capable of being manufactured at an industrial scale and at a low cost.

Thus, an embodiment provides an optoelectronic device comprising semiconductor elements, each semiconductor element resting on a support through an opening formed in a portion at least partially covering the support and at least a first part of which is insulating, the height of the opening being greater than or equal to 100 nm and smaller than or equal to 3,000 nm and the ratio of the height to the smallest diameter of the opening being greater than or equal to 0.5 and smaller than or equal to 10.

According to an embodiment, the semiconductor elements are nanowires, microwires, and/or nanometer- or micrometer-range pyramid-shaped structures.

According to an embodiment, the height is greater than or equal to 200 nm.

According to an embodiment, the ratio is greater than or equal to 1.

According to an embodiment, the average diameter of the opening is constant all along the height of the portion.

According to an embodiment, the average diameter of the opening continuously decreases from the top of the opening to the base of the opening.

According to an embodiment, the opening successively comprises, from the base of the opening, a first part and a second part, the average diameter of the first part being constant all along the height of the first part and the average diameter of the second portion being constant all along the height of the second part and different from the average diameter of the first part.

According to an embodiment, the average diameter of the first part is strictly smaller than the average diameter of the second part.

According to an embodiment, the average diameter of the first part is greater than the average diameter of the second part.

According to an embodiment, the first part of the portion comprises at least one material from among silicon oxides, silicon nitrides, and aluminum oxides.

According to an embodiment, at least a second part of the portion comprises at least one material which is not electrically insulating.

According to an embodiment, the second part of the portion comprises at least one of the materials selected from the group comprising AlN, Ti, TiN, Ta, TaN, Hf, HfN, W, WN, Mo.

According to an embodiment, each semiconductor element is mainly made of a III-V compound.

According to an embodiment, each semiconductor element mainly comprises gallium nitride.

An embodiment provides a method of manufacturing an optoelectronic device, comprising the steps of:

forming, on a support, a portion at least partially covering the support and having at least one first insulating part;

forming an opening crossing the portion, the height of the opening being greater than or equal to 100 nm and smaller than or equal to 3,000 nm and the ratio of the height to the average diameter of the opening at the top of the portion being greater than or equal to 0.5 and smaller than or equal to 10; and growing in each opening a semiconductor element resting on the support.

According to an embodiment, the height of the portion is greater than or equal to 100 nm and smaller than or equal to 1,000 nm.

According to an embodiment, the forming of the portion comprises the steps of:

depositing a first insulating layer comprising a first insulating material;

depositing a second insulating layer comprising a second insulating material different from the first insulating material;

forming a first part of the opening in the first insulating layer;

forming a second part of the opening in the second part of the insulating layer, the average diameter of the first part being different from the average diameter of the second part; and growing in each first and second part of the opening a semiconductor element resting on the support.

According to an embodiment, the forming of the portion comprises the steps of:

depositing a first insulating layer comprising a first insulating material;

forming a first part of the opening in the first insulating layer;

depositing a second insulating layer comprising a second insulating material different from the first insulating material;

forming a second part of the opening in the second part of the insulating layer, the average diameter of the first part being different from the average diameter of the second part; and growing in each first and second part of the opening a semiconductor element resting on the support.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the biasing means of the optoelectronic device are well known and will not be described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present description relates to optoelectronic devices comprising semiconductor elements having the shape of microwires, of nanowires, or of pyramids.

Term "microwire" or "nanowire" designates a three-dimensional structure of elongated shape along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

In the following description, term pyramid or truncated pyramid designates a three-dimensional structure, part of which has a pyramidal or elongated conical shape. The pyramidal structure may be truncated, that is, the tip of the cone is absent and replaced by a flat area. The base of the pyramid is inscribed within a polygon having a side dimension from 100 nm to 10 μm, preferably from 1 to 3 μm. The polygon forming the base of the pyramid may be a hexagon. The height of the pyramid between the base of the pyramid and the apex or the top plateau varies from 100 nm to 20 μm, preferably from 1 μm to 10 μm.

In the following description, embodiments will be described in the case of an optoelectronic device with light-emitting diodes. It should however be clear that these embodiments may concern other applications, particularly devices dedicated to the detection or to the measurement of an electromagnetic radiation or devices dedicated to photovoltaic applications.

Figure 1:
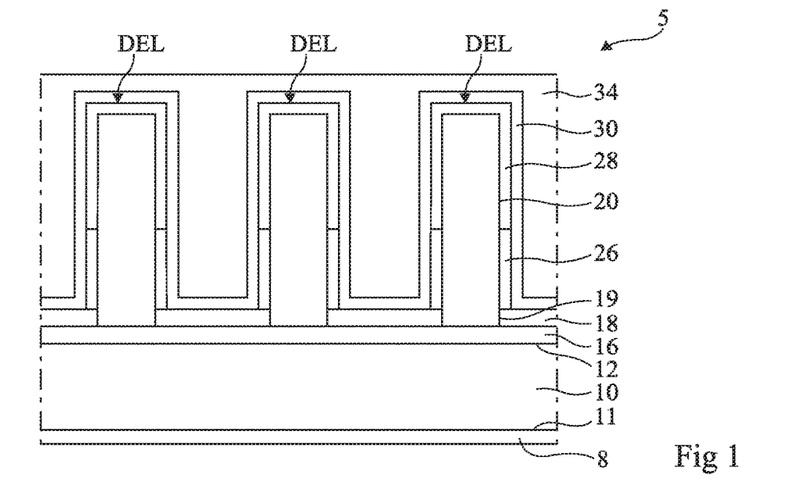
FIG. 1 is a partial simplified cross-section view of an example of an optoelectronic device comprising microwires or nanowires.

FIG. 1 is a partial simplified cross-section view of an example of an optoelectronic device 5 comprising light-emitting diodes.

FIG. 1 shows a structure comprising, from bottom to top:
a first electrode 8;
a semiconductor substrate 10 comprising a lower surface 11 and an upper surface 12, lower surface 11 being covered with first electrode 8 and upper surface 12 being preferably planar at least at the level of the light-emitting diodes;
a seed layer 16 made of a conductive material favoring the wire growth and arranged on surface 12;
an insulating layer 18 covering seed layer 12 and comprising openings 19 exposing portions of seed layer 16;
wires 20 (three wires being shown), each wire 20 being in contact with seed layer 16 through one of openings 19;
an insulating layer 26 extending on the lateral sides of a lower portion of each wire 20;
a shell 28 comprising a stack of semiconductor layers covering an upper portion of each wire 20;
a layer 30 forming a second electrode covering each shell 28 and further extending on insulating layer 26; and
an encapsulation layer 34 covering the entire structure and particularly electrode 30.

The assembly formed by each wire 20 and the associated shell 28 forms a light-emitting diode LED. Shell 28 particularly comprises an active layer which is the layer from which most of the electromagnetic radiation supplied by light-emitting diode LED is emitted. Light-emitting diodes LED may be connected in parallel and form an assembly of light-emitting diodes. The assembly may comprise from a few light-emitting diodes LED to some thousand light-emitting diodes.

Figure 2A:
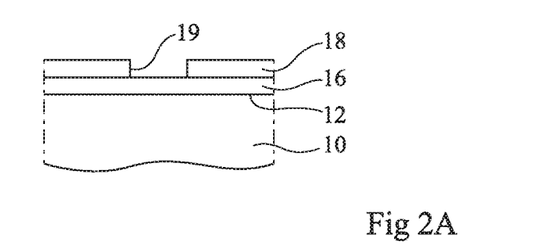
FIGS. 2A to 2C are partial simplified cross-section views of the structures obtained at successive steps of a method of manufacturing the optoelectronic device shown in FIG. 1.
Figure 2B:
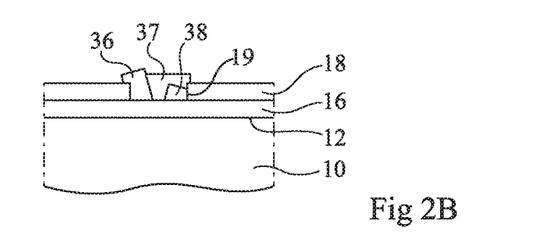
Figure 2C:
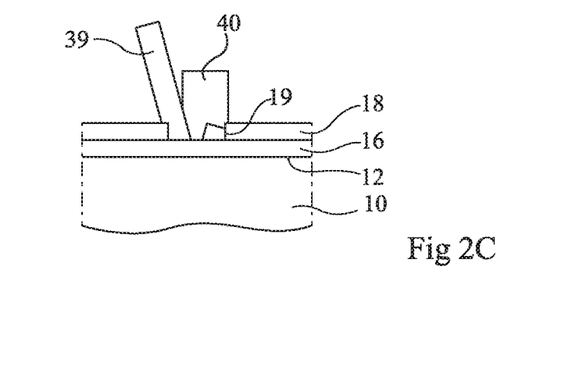

FIGS. 2A to 2C illustrate the initial steps of an example of a method of manufacturing optoelectronic device 5 shown in FIG. 1.

FIG. 2A shows the structure obtained after the steps of:
forming on surface 12 of substrate 10 seed layer 16, for example, by epitaxy;
forming insulating layer 18 on seed layer 16;
forming openings 19 in insulating layer 18, a single opening 19 being shown in FIGS. 2A to 2C.

Insulating layer 18 may be made of a dielectric material, for example, silicon oxide (SiO2). As an example, the thickness of insulating layer 18 is in the range from 5 nm to 100 nm, for example, equal to approximately 30 nm. The cross-section of each opening 19 substantially corresponds to the desired cross-section of wire 20. Preferably, the diameter of wire 20 is in the range from 100 nm to 1 μm, preferably from 300 nm to 800 nm.

FIG. 2B shows the structure obtained after the growth of seeds in openings 19, for example, by metal-organic chemical vapor deposition (MOCVD). The inventors have shown that a plurality of seeds may form in a same opening 19, three seeds 36, 37, 38 being shown as an example in FIG. 2B.

FIG. 2C shows the structure obtained after the growth of wires. As shown in the drawing, when several seeds 36, 37, 38 are initially present in a same opening 19, a plurality of wires 39, 40 may grow from opening 19 with different growth axes.

Figure 3:
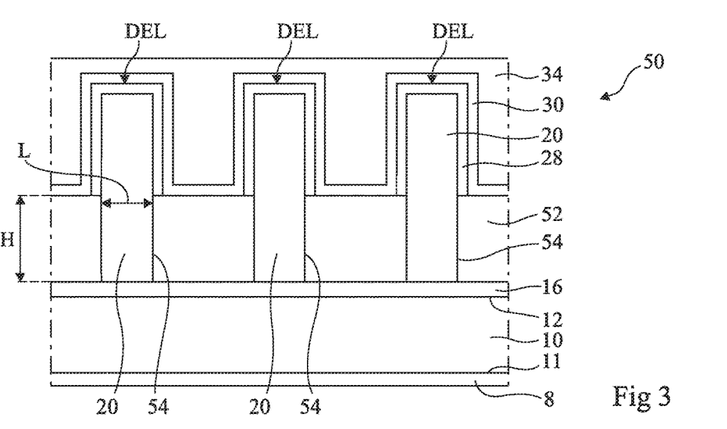
FIGS. 3 to 5 are partial simplified cross-section views of embodiments of optoelectronic devices comprising microwires or nanowires.

FIG. 3 is a partial simplified cross-section view of an embodiment of an optoelectronic device 50 comprising light-emitting diodes, having its semiconductor elements corresponding to nanowires or microwires.

Optoelectronic device 50 comprises the same elements as optoelectronic device 5 shown in FIG. 1, with the difference that insulating layer 18 is replaced with a layer 52 comprising openings 54, each of which has one of wires 20 growing therein. Layer 52 with its associated openings 54 may have characteristics different from layer 18, as detailed hereafter. In the following description, the end of opening 54 most remote from nucleation layer 16 is called top of opening 54 and the end of opening 54 closest to nucleation layer 16 is called base of the opening.

Figure 4:
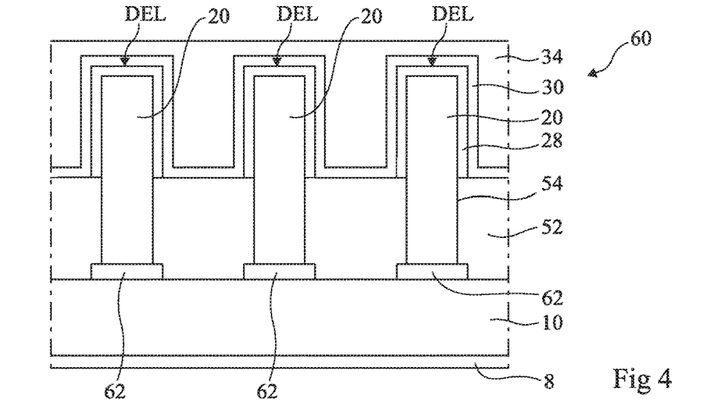

FIG. 4 is a partial simplified cross-section view of another embodiment of an optoelectronic device 60 comprising light-emitting diodes. Optoelectronic device 60 comprises the same elements as optoelectronic device 50 shown in FIG. 3, except that seed layer 16 is replaced with seed pads 62, also called seed islands. Each wire 20 grows on one of seed pads 62.

Figure 5:
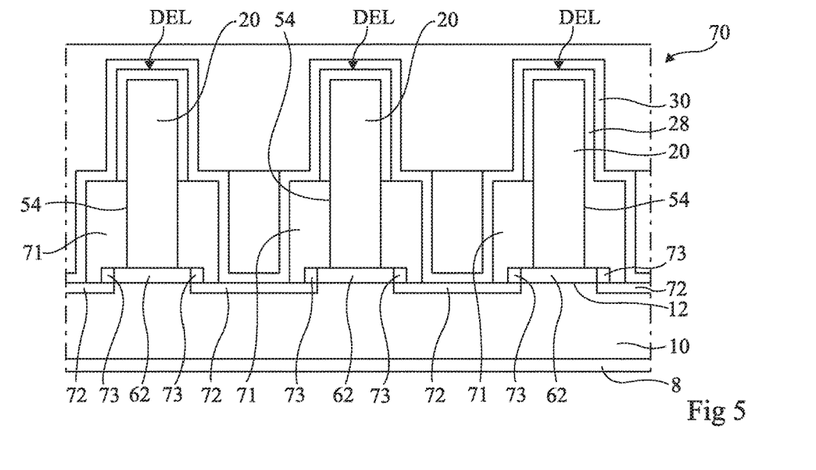

FIG. 5 is a partial simplified cross-section view of another embodiment of an optoelectronic device 70 comprising light-emitting diodes. Optoelectronic device 70 comprises the same elements as optoelectronic device 60 shown in FIG. 4, except that insulating layer 52 is divided into insulating blocks 71, each insulating block 71 covering one of seed pads 62 and comprising opening 54. Optoelectronic device 70 further comprises a dielectric region 72 which extends into substrate 10 from surface 12 between seed pads 62 and, possibly, a dielectric region 73 on the lateral sides of each seed portion 62, no wire growth occurring on dielectric regions 72, 73.

Figure 6:
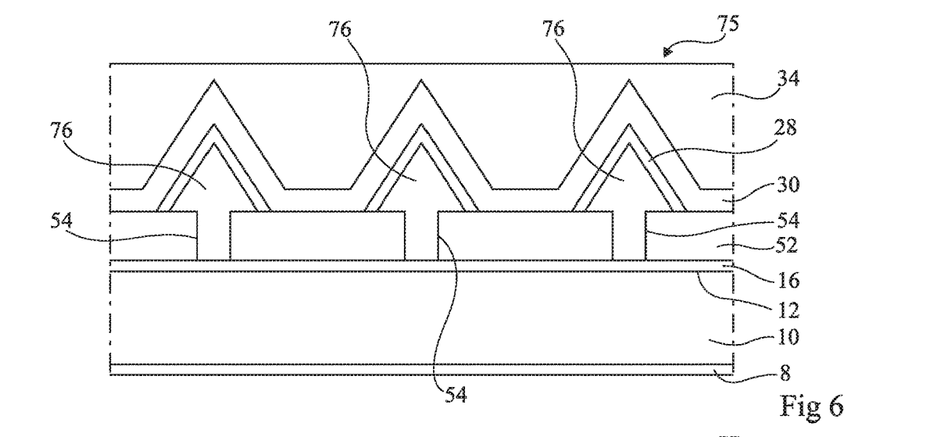
FIGS. 6 and 7 are partial simplified cross-section views of embodiments of optoelectronic devices respectively with pyramids and truncated pyramids.

FIG. 6 is a partial simplified cross-section view of another embodiment of an optoelectronic device 75 comprising light-emitting diodes. Optoelectronic device 75 comprises the same elements as optoelectronic device 50 shown in FIG. 3, with the difference that the portion of each wire 20 outside of opening 54 is replaced with a pyramid 76. The base of pyramid 76 rests on layer 52 and is wider than underlying opening 54.

Figure 7:
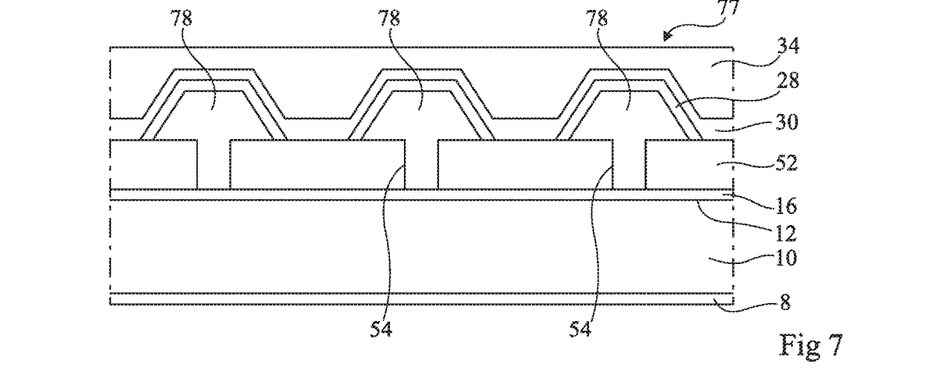

FIG. 7 is a partial simplified cross-section view of another embodiment of an optoelectronic device 77 comprising light-emitting diodes. Optoelectronic device 77 comprises the same elements as optoelectronic device 75 shown in FIG. 6, with the difference that each pyramid 76 is replaced with a truncated pyramid 78. In the following description, unless otherwise mentioned, term pyramid indifferently designates a full pyramid 76 such as shown in FIG. 6 or a truncated pyramid 78 such as shown in FIG. 7.

In the case of wires 20, the wire diameter is substantially the same as the corresponding diameter of opening 54. In the case of pyramids 76, 78, a widening of the semiconductor structure starting just at the exit of opening 54 can be observed.

The cross-section of openings 54 may have different shapes, such as, for example, an oval, circular, or polygonal shape, particularly triangular, rectangular, square or hexagonal. Term "diameter" or of "average diameter" in a cross-section of an opening or of a wire designates a quantity associated with the surface of the targeted structure in this cross-section, for example corresponding to the diameter of the disk having the same surface as the cross-section of the opening or of the wire. This same principle of equivalent diameter may be applied to pyramidal structures, especially for the pyramid base.

Call H the height of opening 54, that is, the thickness of layer 52, and L the diameter of opening 54. Preferably, diameter L of opening 54 is substantially constant all along height H. As an example, height H of each opening 54 is in the range from 100 nm to 1,500 nm, preferably from 200 nm to 1,000 nm, more preferably from 300 nm to 1,000 nm. As an example, diameter L of each opening 54 is in the range from 200 nm to 1 μm, preferably from 300 nm to 800 nm. Ratio F of height H to diameter L is in the range from 0.5 to 15, preferably from 1 to 10, particularly approximately 1.5.

The inventors have shown that when openings 54 have the previously-indicated dimensions H, L, and F, the growth of a single wire 20 per opening 54 can be observed.

Substrate 10 may correspond to a monoblock structure or correspond to a layer covering a support made of another material. Substrate 10 is preferably a semiconductor substrate, for example, a substrate made of silicon, of germanium, of silicon carbide, of a III-V compound, such as GaN or GaAs, or a ZnO substrate. Preferably, substrate 10 is a single-crystal silicon substrate. Preferably, it is a semiconductor substrate compatible with the manufacturing methods implemented in microelectronics. Substrate 10 may correspond to a multilayer structure of silicon on insulator type, also called SOI.

Substrate 10 may be heavily doped, lightly-doped or non-doped. In the case where the substrate is heavily-doped, semiconductor substrate 10 may be doped to lower the electric resistivity down to a resistivity close to that of metals, preferably smaller than a few mohm.cm. Substrate 10 is, for example, a heavily-doped substrate 10 with a dopant concentration in the range from $5*10^{16}$ atoms/cm3 to $2*10^{20}$ atoms/cm3. In the case where the substrate is lightly-doped, for example, with a dopant concentration smaller than or equal to $5*10^{16}$ atoms/cm3, preferably substantially equal to $10^{15}$ atoms/cm3, a doped region of the first conductivity type or of a second conductivity type, opposite to the first type, more heavily-doped than the substrate may be provided, which extends in substrate 10 from surface 12 under seed layer 16. In the case of a silicon substrate 10, examples of P-type dopants are boron (B) or indium (In) and examples of N-type dopants are phosphorus (P), arsenic (As), or antimony (Sb). Surface 12 of silicon substrate 10 may be a (100) surface.

Seed layer 16 or seed pads 62 are made of a material favoring the growth of wires 20 or of pyramids 76, 78. As an example, the material forming seed layer 16 or seed pads 62 may be a nitride, a carbide, or a boride of a transition metal from column IV, V, or VI of the periodic table of elements or a combination of these compounds. As an example, seed layer 16 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum nitride and carbide (TaCN), of magnesium nitride in $Mg_xN_y$ form, where x is approximately equal to 3 and y is approximately equal to 2, for example, magnesium nitride according to form $Mg_3N_2$ or magnesium gallium nitride (MgGaN), of tungsten (W), of tungsten nitride (WN), or of a combination thereof. Seed layer 16 may be doped with the same conductivity type as substrate 10.

Insulating layer 52 may be made of a dielectric material, for example, of silicon oxide (SiO2), of silicon nitride ($Si_xN_y$, where x is approximately equal to 3 and y is approximately equal to 4, for example, Si3N4), of silicon oxynitride (particularly of general formula $SiO_xN_y$, for example, Si2ON2), of aluminum oxide (Al2O3), of hafnium oxide (HfO2), or of diamond.

Insulating layer 52 may have a monolayer structure or may correspond to a stack of two layers or of more than two layers. When insulating layer 52 corresponds to a stack of at least two layers, the upper layer of the stack is of insulating type, for example, made of a dielectric material. The lower layer(s) of the stack between seed layer 16 and the upper insulating layer may be made of a dielectric material. As a variation, the lower layer(s) may be made of a semiconductor or metallic material, for example, of aluminum nitride (AlN), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB2), of zirconium nitride (ZrN), of silicon carbide (SiC), of tantalum nitride and carbide (TaCN), of tungsten (W), or of tungsten nitride (WN). This list is not limiting. A "sandwich" of conductive and insulating materials may also be formed. In particular, layer 52 may comprise a stack of a plurality of layers, some of which may be used as etch stop layers during etching operations. In particular, seed layer 16 may be covered with a protection layer having a height in the range from 30 nm to 50 nm.

Wires 20 are at least partly made of at least one semiconductor material. The semiconductor material may be silicon, germanium, silicon carbide, a III-V compound, a II-VI compound, or a combination of at least two of these compounds.

Wires 20 or pyramids 76, 78 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 20 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Wires 20 or pyramids 76, 78 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn)

The height of each wire 20 may be in the range from 250 nm to 50 µm. Each wire 20 may have an elongated semiconductor structure along an axis substantially perpendicular to surface 12. Each wire 20 may have a generally cylindrical shape. The axes of two adjacent wires 20 may be distant by from 0.5 µm to 10 µm and preferably from 1.5 µm to 4 µm. As an example, wires 20 may be regularly distributed, particularly in a hexagonal network.

The height of each pyramid 76, 78 may be in the range from 100 nm to 25 µm. Each pyramid may have an elongated semiconductor structure along an axis substantially perpendicular to surface 12. The base of each pyramid 76, 78 may have a general shape of oval, circular, or polygonal type, particularly triangular, rectangular, square, or hexagonal. The centers of two adjacent pyramids may be distant by from 0.25 µm to 10 µm and preferably from 1.5 µm to 4 µm. As an example, the pyramids may be regularly distributed, particularly in a hexagonal network.

Shell 28 may comprise a stack of a plurality of layers especially comprising:
- an active layer covering the upper portion of wire 20 or the associated pyramid 76, 78;
- an intermediate layer having a conductivity type opposite to the lower portion of wire 20 covering the active layer; and
- a bonding layer covering the intermediate layer and covered with electrode 30.

The active layer is the layer having most of the radiation supplied by light-emitting diode LED emitted therefrom. According to an example, the active layer may comprise confinement means, such as multiple quantum wells. It is for example formed of an alternation of GaN and InGaN layers having respective thicknesses from 3 to 20 nm (for example, 6 nm) and from 1 to 10 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and enables to form a P-N or P-I-N junction, the active layer being between the intermediate P-type layer and the upper N-type portion of wire 20 of the P-N or P-I-N junction.

The bonding layer may correspond to a semiconductor layer or to a stack of semiconductor layers and enables to form an ohmic contact between the intermediate layer and electrode 30. As an example, the bonding layer may be very heavily doped with the type opposite to the lower portion of wire 20 or of pyramid 76, 78, to degenerate the semiconductor layers, for example, P-type doped with a concentration greater than or equal to $10^{20}$ atoms/cm3.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to ensure a good distribution of electric carriers in the active layer.

Electrode 30 is capable of biasing the active layer of each wire 20 and of giving way to the electromagnetic radiation emitted by light-emitting diodes LED. The material forming electrode 30 may be a transparent conductive material such as indium tin oxide (or ITO), aluminum zinc oxide, or graphene. As an example, electrode layer 30 has a thickness in the range from 5 nm to 200 nm, preferably from 20 nm to 50 nm.

Encapsulation layer 34 is made of an at least partially transparent insulating material. The maximum thickness of encapsulation layer 34 is in the range from 250 nm to 50 µm so that encapsulation layer 34 totally covers electrode 30 at the top of light-emitting diodes LED.

As a variation, a mirror conductive layer, not shown, covering electrode layer 30 between wires 20 or between pyramids 76, 78 but without extending wires 20, may be provided. The mirror conductive layer may correspond to a metal layer, for example, made of aluminum, of silver, of copper, or of zinc.

According to another variation, optoelectronic device 50 may further comprise a phosphor layer, not shown, provided on encapsulation layer 34 or confounded therewith.

An embodiment of a method of manufacturing optoelectronic device 50 shown in FIG. 3 will be described in relation with FIGS. 8A to 8C.

Figure 8A:
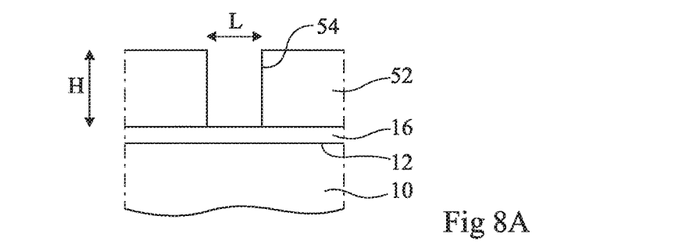
FIGS. 8A to 8C are partial simplified cross-section views of the structures obtained at successive steps of another embodiment of a method of manufacturing the optoelectronic device shown in FIG. 3.

FIG. 8A illustrates the structure obtained after having implemented the steps of:
(1) Forming on surface 12 substrate 10 of seed layer 16.

Seed layer 16 may be deposited by a method of chemical vapor deposition (CVD) or metal-organic chemical vapor deposition (MOCVD), also known as metal-organic vapor phase epitaxy (MOVPE). However, methods such as molecular beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE), or an atomic layer deposition (ALD), may be used. Further, methods such as evaporation of reactive cathode sputtering may be used.

When seed layer 16 is made of aluminum nitride, it may be substantially textured and have a preferred polarity. The texturing of layer 16 may be obtained by an additional treatment performed after the deposition of the seed layer. It for example is an anneal under an ammonia flow (NH3).

(2) Depositing insulating layer 52, for example, by conformal deposition, particularly by CVD; and (3) Forming openings 54 in insulating layer 52, a single opening 54 being shown in FIG. 8A. It may be an anisotropic etching, for example, a reactive ion etching or RIE or an inductively coupled plasma or ICP etching.

Figure 8B:
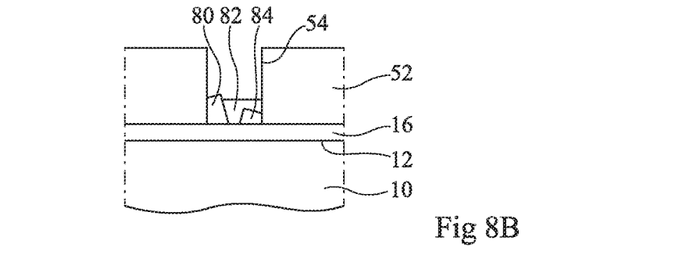

FIG. 8B illustrates the structure obtained after the step of:
(4) Forming seeds in each opening 54, three seeds 80, 82, 84 being shown as an example in FIG. 8B.

The method of forming seeds 80, 82, 84 may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

As an example, the seed forming method may comprise injecting into a reactor a precursor of a group-III element and a precursor of a group-V element. Examples of group-III precursors are trimethylgallium (TMGa), triethylgallium (TEGa), trimethylindium (TMIn), or trimethylaluminum (TMAl). Examples of precursors of group-V elements are ammonia (NH3), tertiarybutylphosphine (TBP), arsine (AsH3), or unsymmetrical dimethylhydrazine (UDMH).

According to an embodiment, the temperature in the reactor at step (4) is lower than or equal to 1,000° C., preferably lower than or equal to 820° C.

According to an embodiment, the ratio of the flow of the group-V element precursor gas to the flow of the group-III element precursor gas, or V/III ratio, at step (4) is greater than or equal to 1,000, preferably greater than or equal to 5,000.

Figure 8C:
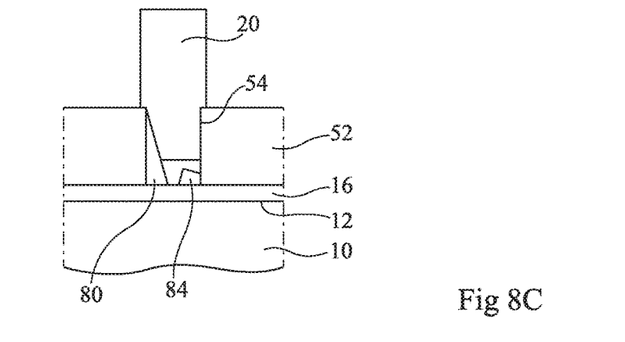

FIG. 8C illustrates the structure obtained after the step of:

(5) Growing a wire 20 in each opening 54.

The method of growing wires 20 may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

As an example, the method of growing wires 20 may comprise injecting into a reactor a precursor of a group-III element and a precursor of a group-V element.

Preferably, the temperature in the reactor at step (4) is lower than the temperature in the reactor at step (5).

Preferably, the V/III ratio at step (4) is greater than the V/III ratio at step (5).

According to an embodiment, the temperature in the reactor at step (5) is higher than or equal to 950° C., preferably higher than or equal to 1,000° C.

According to an embodiment, the V/III ratio at step (5) is smaller than or equal to 100, preferably smaller than or equal to 50.

According to an embodiment of the invention, at step (4) and in a first phase of growth of the wires of the III-V compound at step (5), a precursor of an additional element is added in excess in addition to the precursors of the III-V compound. The additional element may be silicon (Si). An example of a precursor of silicon is silane ($SiH_4$).

The presence of silane among the precursor gases causes the incorporation of silicon within the GaN compound. An N-type doped lower portion of wire 20 is thus obtained. This further results in the forming of a silicon nitride layer, not shown, which covers the periphery of the lower portion of the wire except for the top along the growth of the lower portion of the wire.

According to an embodiment of the invention, in a second phase of growth of the wires of the III-V compound, the previously-described operating conditions of the MOCVD reactor are, as an example, maintained except for the fact that the silane flow in the reactor is decreased, for example, by a factor greater than or equal to 10, or stopped. Even when the silane flow is stopped, the upper portion of the wire thus obtained may be N-type doped due to the diffusion in this active portion of dopants originating from the adjacent passivated portions or due to the residual doping of the GaN.

As appears in FIG. 8C, the fact of having a sufficiently large height H of insulating layer 52 results in that only the microwire having a growth axis substantially parallel to the axis of opening 54 succeeds in growing outside of opening 54.

The subsequent steps of the method of manufacturing optoelectronic device 50 are the following:

(6) Forming by epitaxy, for each wire 20, the layers which form shell 28. The deposition of the layers forming shell 28 only occurs on the portion of wire 20 outside of opening 54 and of insulating layer 52.

(7) Forming second electrode 30, for example, by conformal deposition.

(8) Forming encapsulation layer 34. When encapsulation layer 34 is made of silicone, encapsulation layer 34 may be deposited by spin coating, by jet printing, or by a silk-screening method. When encapsulation layer 34 is an oxide, it may be deposited by CVD.

(9) Forming by deposition first electrode 8, covering lower surface 11 of substrate 10.

(10) Sawing substrate 10 to separate the optoelectronic devices.

As an example, above-described step (9) may be carried out between above-described step (7) and step (8) or between above-described step (6) and step (7).

An embodiment of a method of manufacturing optoelectronic device 60, shown in FIG. 4, comprises above-described steps (1) to (10) with the difference that step (1) is replaced with step (11) of:

(11) Forming nucleation layer 16 according to above-described step (1) and etching seed layer 16 to form seed pads 62. Seed layer 16 may be etched by dry etching, for example, a reactive ion etching or RIE, or an inductively coupled plasma or ICP etching.

An embodiment of a method of manufacturing optoelectronic device 70, shown in FIG. 5, comprises above-described steps (1) to (10) with the difference that step (1) is replaced with step (12) of:

(12) Forming nucleation pads 62 according to previously-described step (11) and protecting the portions of surface 12 of substrate 10 which are not covered with seed pads 62 and, possibly, the lateral sides of seed pads 62 to avoid a subsequent wire growth on these portions. According to an example, this may be performed by the forming of a mask at the top of each seed pad 62 and by an oxidation step which causes the forming of dielectric regions 72 at the surface of substrate 10 between seed pads 62 and dielectric regions 73 on the lateral sides of each seed pad 62. According to another example, this may be performed by a step of nitriding the surface of substrate 10 and seed pads 62, which causes the forming of dielectric regions 72 at the surface of substrate 10 between seed pads 62.

An embodiment of a method of manufacturing optoelectronic devices 75 or 77, respectively shown in FIG. 6 or 7, comprises above-described steps (1) to (10), with the difference that step (5) is replaced with step (13) of:

(13) Growing pyramids 76, 78 from each opening 54. The method of growing pyramids 76, 78 may be a method of CVD, MOCVD, MBE, GSMBE, PAMBE, ALE, HVPE, ALD type. Further, electrochemical methods may be used, for example, the CBD method, hydrothermal methods, liquid-feed flame spray pyrolysis, or electrodeposition. The growth conditions are selected to grow the crystal structures preferably in the form of pyramids rather than in the form of wires.

Figure 9:
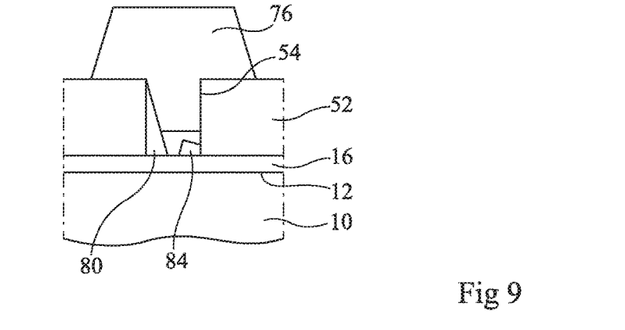
FIG. 9 is a partial simplified cross-section view of the structure obtained at a step of an embodiment of a method of manufacturing the optoelectronic device shown in FIG. 7.

FIG. 9 shows the structure obtained at step (13) during the growth of pyramid 76.

The above-described replacing of step (1) with step (11) may also be applied for pyramidal or truncated pyramidal structures.

Figure 10:
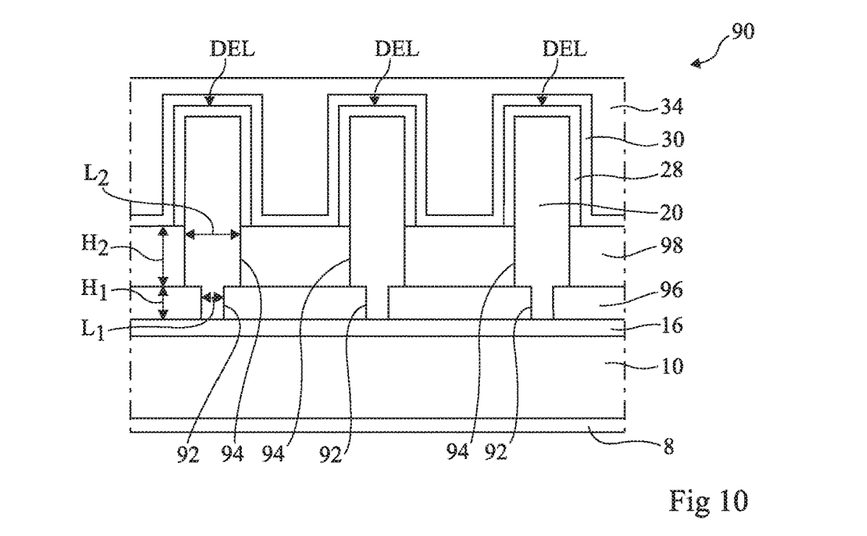
FIGS. 10 and 11 are partial simplified cross-section views of other embodiments of optoelectronic devices comprising microwires or nanowires.

FIG. 10 is a partial simplified cross-section view of an embodiment of an optoelectronic device 90 comprising light-emitting diodes.

Optoelectronic device 90 comprises the same elements as optoelectronic device 50 shown in FIG. 3, with the difference that each opening 54 is replaced with an opening comprising two successive opening parts 92 and 94 having different dimensions. The two opening parts 92, 94 are preferably coaxial. As an example, insulating layer 52 is replaced with a stack of two insulating layers 96 and 98. Insulating layer 96 covers nucleation layer 16 and comprises openings 92. Each opening 92 exposes a portion of nucleation layer 16. Each opening 92 has a height H1 and a diameter L1, preferably substantially constant all along height H1. Insulating layer 98 covers insulating layer 96 and comprises openings 94. Each opening 94 exposes one of openings 92 and a portion of nucleation layer 96 around opening 92. Each opening 94 has a height H2 and a diameter L2, preferably substantially constant all along height H2.

In the present embodiment, diameter L1 is smaller than diameter L2.

As an example, height H1 of each opening 92, that is, the thickness of insulating layer 96, is in the range from 30 nm to 500 nm, preferably from 100 nm to 300 nm. As an example, diameter L1 of each opening 92 is in the range from 30 nm to 1 µm, preferably from 100 nm to 600 nm. Ratio F1 of height H1 to diameter L1 is in the range from 0.1 to 4, preferably from 0.75 to 1.5.

As an example, height H2 of each opening 94, that is, the thickness of insulating layer 98, is in the range from 200 nm to 2,000 nm, preferably from 250 nm to 500 nm. As an example, diameter L2 of each opening 94 is in the range from 50 nm to 2 µm, preferably from 150 nm to 800 nm. Ratio F2 of height H2 to diameter L2 is in the range from 0.1 to 4, preferably from 0.75 to 1.5.

Insulating layers 96, 98 may be made of the same material or of different materials. As an example, one of layers 96, 98 is made of silicon oxide (SiO2) and the other layer is made of silicon nitride (SixNy, where x is approximately equal to 3 and y is approximately equal to 4, for example, Si3N4). As a variation, openings 92, 94 are formed in a single insulating layer.

As a variation, layer 96 is not made of an insulating material but of a semiconductor material, particularly AlN, or a metallic material, particularly Ti, TiN, Ta, TaN, Hf, HfN, W, Mo, for example, with one of the materials previously described for the lower layers of layer 52.

Diameter L1 of opening 92 is selected to favor the growth of a single seed in opening 92. Diameter L2 of opening 94 is selected according to the desired diameter of wire 20.

An embodiment of a method of manufacturing optoelectronic device 90 comprises previously-described steps (1) to (10) with the difference that steps (2) and (3) are replaced with step (14) of:

(14) Successively depositing insulating layers 96 and 98 and forming openings 94 and openings 92.

When the materials forming insulating layers 96 and 98 are different, openings 94 may be formed in insulating layer 98 by an etching which is selective over the material forming insulating layer 96. When the materials forming insulating layers 96 and 98 are the same, the depth of openings 94 may be controlled by the duration of the etching.

A variation of this method comprises first depositing layer 96 and then forming each opening 92. After this step, insulating layer 98 is deposited, and may possibly fill openings 92. Openings 94 are then formed by using an etching selective over the material forming insulating layer 98.

Figure 11:
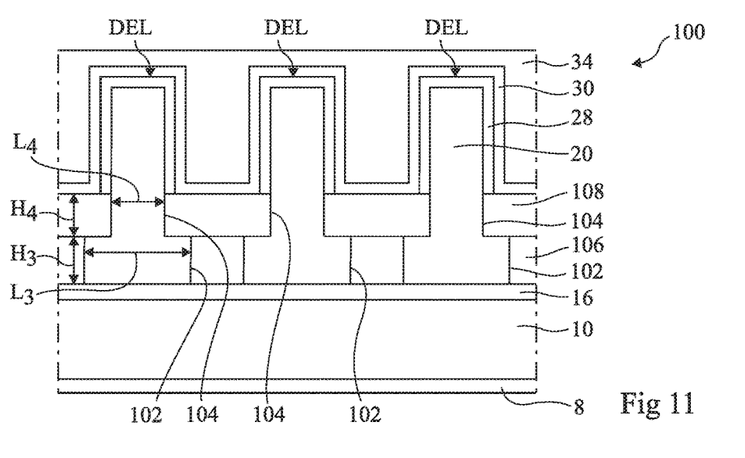

FIG. 11 is a partial simplified cross-section view of an embodiment of an optoelectronic device 100 comprising light-emitting diodes.

Optoelectronic device 100 comprises the same elements as optoelectronic device 50 shown in FIG. 3, with the difference that each opening 54 is replaced with an opening comprising two successive portions 102 and 104 having different dimensions. As an example, insulating layer 52 is replaced with a stack of two layers 106 and 108, layer 106 covering nucleation layer 16 and comprising openings 102. Layer 108 is made of an electrically insulating material. Each opening 102 exposes a portion of nucleation layer 16. Each opening 102 has a height H3 and a diameter L3, preferably substantially constant all along height H3. Insulating layer 108 comprises openings 104, covers insulating layer 106 and is cantilever with said insulating layer 106 at the level of each opening 102. Each opening 104 has a height H4 and a diameter L4.

In the present embodiment, diameter L4 is smaller than diameter L3.

As an example, height H3 of each opening 102, that is, the thickness of insulating layer 106, is in the range from 30 nm to 500 nm, preferably from 100 nm to 300 nm. As an example, diameter L3 of each opening 102 is in the range from 100 nm to 2 µm, preferably from 200 nm to 800 nm. Ratio F3 of height H3 to diameter L3 is in the range from 0.1 to 5, preferably from 0.4 to 1.5.

As an example, height H4 of each opening 104, that is, the thickness of insulating layer 108, is in the range from 50 nm to 500 nm, preferably from 100 nm to 300 nm. As an example, diameter L4 of each opening 104 is in the range from 30 nm to 1 µm, preferably from 100 to 400 nm. Ratio F4 of height H4 to diameter L4 is in the range from 0.1 to 2, preferably from 0.5 to 2.0.

According to an embodiment, insulating layers 106, 108 are made of different materials. As an example, one of layers 106, 108 is made of silicon oxide (SiO2) and the other layer is made of silicon nitride (SixNy, where x is approximately equal to 3 and y is approximately equal to 4, for example, Si3N4). According to another embodiment, layer 106 is made of aluminum nitride and layer 108 is made of silicon nitride.

Diameter L3 of opening 102 is selected to substantially ascertain that at least one seed will grow in opening 102 on nucleation layer 16. Diameter L4 of opening 94 is selected according to the desired diameter of wire 20 and is sufficiently narrow to select the wire originating from a single seed in the case where a plurality of seeds form in opening 102.

Advantageously, the dimensions of opening 102 are a control parameter of the seed forming and the dimensions of opening 104 are a control parameter of the selection of a single wire. Thereby, the control parameters of the seed forming and of the selection of a single wire do not depend on a single opening and may be adjusted independently.

Figure 12A:
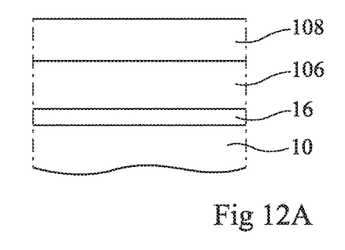
FIGS. 12A to 12C and FIGS. 13A and 13B are partial simplified cross-section views of the structures obtained at successive steps of embodiments of a method of manufacturing the optoelectronic device shown in FIG. 11.
Figure 12B:
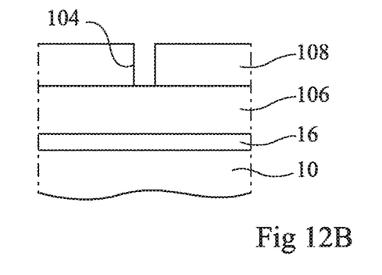
Figure 12C:
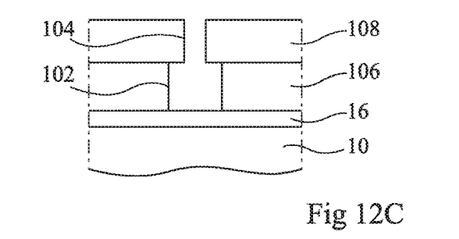

An embodiment of a method of manufacturing optoelectronic device 100 shown in FIG. 11 will be described in relation with FIGS. 12A to 12C. The embodiment is described in the case where layers 106 and 108 are insulating layers. However, this embodiment may be applied in the case where layer 106 is not electrically insulating. This embodiment comprises above-described steps (1) to (10), with the difference that steps (2) and (3) are replaced with the steps of:

(15) Successively depositing insulating layers 106 and 108 (FIG. 12A).

(16) Forming opening 104 by anisotropic etching (FIG. 12B) of the material of insulating layer 108, the etching being selective or not over the material of insulating layer 106. In the case where this etching is not selective over the material of insulating layer 106, the etching ends after a determined time.

(17) Forming opening 102 by isotropic etching (FIG. 12C), from opening 104, of the material of insulating layer 106, the etching being selective over the material of insulating layer 108.

Examples of isotropic etchings of silicon oxide or of silicon nitride are hydrofluoric acid (HF), buffered hydrofluoric acid (BHF), ammonium fluoride (NH4F), or a BOE (buffered oxide etch) solution.

Examples of anisotropic etchings of silicon oxide or of silicon nitride are trifluoromethane (CHF3), carbon tetrafluoride (CF4), sulfur hexafluoride (SF6), or nitrogen trifluoride (NF3), to which inert or nearly inert carrier gases such as dihydrogen, helium, argon or oxygen may be added, to adjust the etch speeds.

As an example, H3PO4 may be used to selectively etch silicon oxide over silicon nitride.

As an example, a carbon-fluorine plasma such as C5F8+ O2+Ar may be used to selectively etch silicon nitride over silicon oxide.

Another embodiment of a method of manufacturing optoelectronic device 100 shown in FIG. 11 will be described in relation with FIGS. 13A and 13B. This embodiment comprises above-described steps (1) to (10), with the difference that steps (2) and (3) are replaced with the steps of:

(18) Successively depositing insulating layers 106 and 108.

Figure 13A:
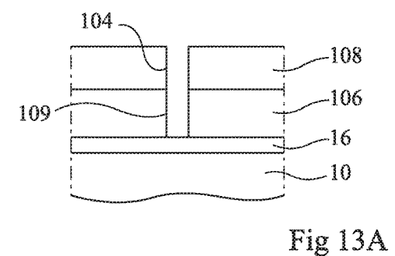
Figure 13B:
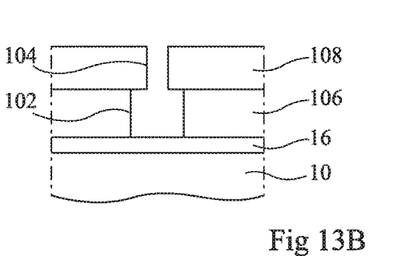

(19) Forming opening 104 by anisotropic etching of the material of insulating layer 108 and then of an opening 109 continuing opening 104 by anisotropic etching of the material of insulating layer 106 (FIG. 13A). The etching used is not selective over the materials forming insulating layers 106 and 108. It is, for example, an etching of CHF3+O2 or CF4+H2 type.

(20) Forming opening 102 by isotropic etching (FIG. 13B), from opening 109, of the material of insulating layer 106, the etching being selective over the material of insulating layer 108.

Figure 14:
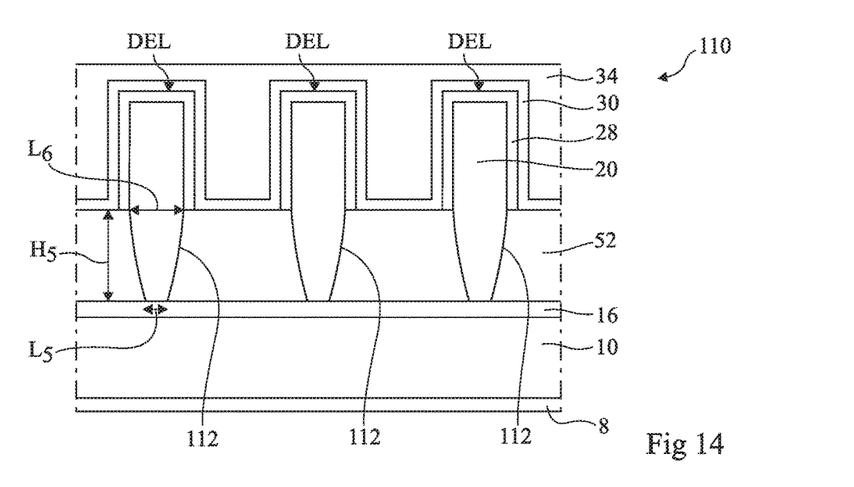
FIG. 14 is a partial simplified cross-section view of another embodiment of an optoelectronic device with microwires or nanowires.

FIG. 14 is a partial simplified cross-section view of an embodiment of an optoelectronic device 110 comprising light-emitting diodes.

Optoelectronic device 110 comprises the same elements as optoelectronic device 50 shown in FIG. 3, with the difference that each opening 54 is replaced with an opening 112 having a height H5 with a diameter which increases according to the height as the distance from substrate 10 increases. Call L5 the smallest diameter of opening 112 and L6 the largest diameter of opening 112.

As an example, height H5 of each opening 112 is in the range from 30 nm to 1 µm, preferably from 200 to 600 nm. As an example, diameter L5 is in the range from 30 nm to 600 nm, preferably from 100 nm to 400 nm. As an example, diameter L6 is in the range from 50 nm to 2 µm, preferably from 350 nm to 800 nm. Ratio F5 of height H5 to diameter L5 is in the range from 0.5 to 10, preferably from 0.75 to 4.

Diameter L5 at the base of opening 112 is selected to favor the growth of a single seed on the portion of seed layer 16 exposed by opening 112. Diameter L6 at the top of opening 112 is selected according to the desired diameter of wire 20.

Figure 15A:
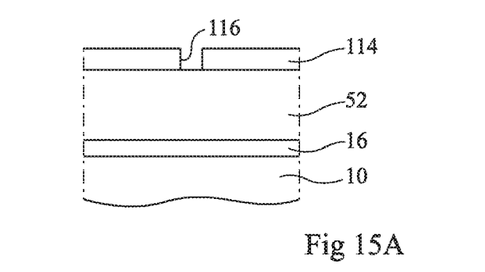
FIGS. 15A to 15C are partial simplified cross-section views of the structures obtained at successive steps of another embodiment of a method of manufacturing the optoelectronic device shown in FIG. 14.
Figure 15B:
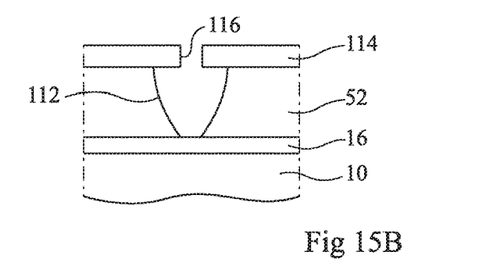

An embodiment of a method of manufacturing optoelectronic device 110 of FIG. 14 will be described in relation with FIGS. 15A to 15C. This embodiment comprises above-described steps (1) to (10), with the difference that steps (2) and (3) are replaced with the steps of:

(21) Successively depositing insulating layer 52 and a resin layer 114 and etching an opening 116 in the resin layer, exposing a portion of insulating layer 52 (FIG. 15A).

(22) Forming opening 112 by partially anisotropic etching (FIG. 15B) of the material of insulating layer 52. As an example, the etching may be a RIE-type etching. The anisotropic character may be stronger at the beginning of the etching than at the end of the etching.

Figure 15C:
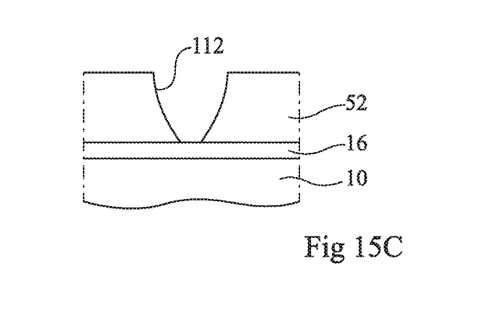

(23) Removing resin layer 114 (FIG. 15C).

As a variation, layer 114 may be a hard mask, for example, made of a dielectric material, for example, silicon oxide SiO2 or silicon nitride SiN.

In the embodiment described hereabove in relation with FIGS. 10 and 11, the seed forming and the wire growth are performed after the forming of openings 92, 94, 102, 104 in layers 96, 98, 106, 108 covering nucleation layer 16. However, as a variation, the seed-forming step and part of the wire growth in openings 92, 102 may be carried out before the step of forming insulating layers 98, 108 and the step of forming openings 94, 104.

Figure 16A:
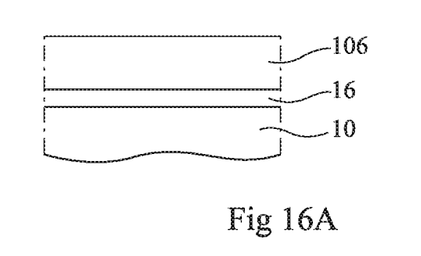
FIGS. 16A to 16F are partial simplified cross-section views of the structures obtained at successive steps of another embodiment of a method of manufacturing the optoelectronic device shown in FIG. 11.

An embodiment of such a method of manufacturing optoelectronic device 100 shown in FIG. 8 will be described in relation with FIGS. 16A to 16F. This embodiment comprises above-described steps (1) to (10), with the difference that steps (2) and (3) are replaced with the steps of:

(24) Depositing layer 106 on seed layer 16 (FIG. 16A).

Figure 16B:
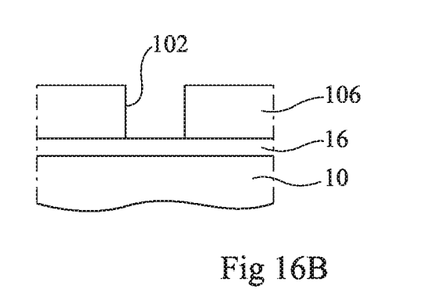

(25) Forming openings 102 in layer 106 (FIG. 16B).

Figure 16C:
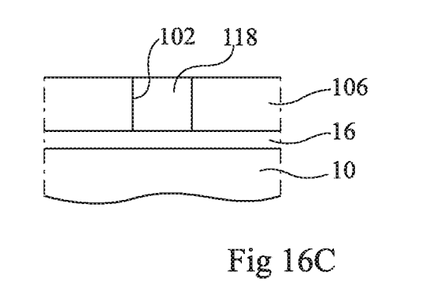

(26) Forming seeds in each opening 102 and growing one or a plurality of wires in each opening 102 to obtain a semiconductor portion 118 substantially totally filling opening 102 (FIG. 16C).

Figure 16D:
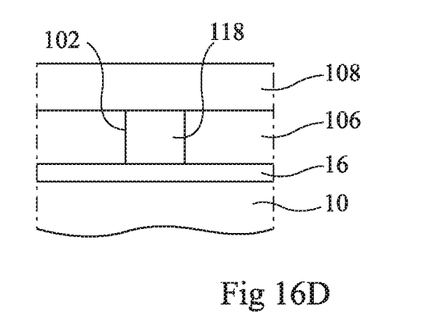

(27) Depositing insulating layer 108 on insulating layer 106 and on semiconductor portions 118 (FIG. 16D).

Figure 16E:
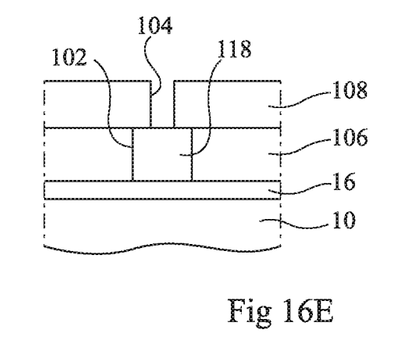

(28) Forming openings 104 in layer 108 to expose part of semiconductor portions 118 (FIG. 16E).

Figure 16F:
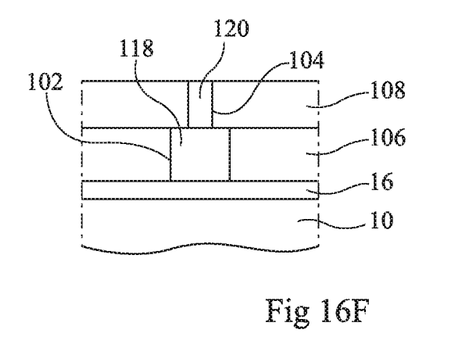

(29) Growing a wire in each opening 104 from semiconductor portion 118, a semiconductor portion 120 being shown in each opening 104 (FIG. 16F).

The embodiments previously described in relation with FIGS. 7, 8, and 11 have been described in the case of a seed layer 16 covering substrate 10. However, these embodiments may also be implemented by using, instead of seed layer 16, seed pads 62 as described in relation with FIG. 4 or by using insulating blocks 71, possibly formed of a stack of two insulating blocks as described in relation with FIG. 5.

The embodiments previously described in relation with FIGS. 10, 11, and 14 have been described in the case of a subsequent growth of semiconductor elements of microwire or nanowire type. These embodiments may also be applied in the case of the growth of semiconductor elements of pyramid or truncated pyramid type.

In the previously-described embodiments, shell 28 covers each wire 20 all the way to insulating layer 52, 98, or 108. However, as a variation, an insulating layer covering a portion of the lateral sides of each wire 20 along part of the height of wires 20 outside of openings 54, 94, 104, 112, may be provided. Shell 28 then covers the lateral sides of wires 20 except at the locations where the insulating layer is present. The insulating layer may further cover part of shell 28.

Specific embodiments of the present invention have been described. Although embodiments have been described for an optoelectronic device for which shell 28 covers the top of the associated wire 20 and part of the lateral sides of wire 20, it is possible to only provide the shell at the top of wire 20.

The invention claimed is:

1. An optoelectronic device comprising:
  semiconductor elements belonging to light-emitting diodes, each semiconductor element resting on a support through an opening formed in an insulating layer at least partially covering the support, the semiconductor element filling completely the opening, wherein:
    the height of the opening is greater than or equal to 200 nm and smaller than or equal to 3,000 nm, wherein the height of the opening is the thickness of the insulating layer at least partially covering the support;
    the ratio of the height to the smallest diameter of the opening being greater than or equal to 1 and smaller than or equal to 10; and the average diameter of the opening decreases continuously from the top of the opening to the base of the opening.

2. The optoelectronic device of claim 1, wherein the semiconductor elements are nanowires, microwires, and/or nanometer- or micrometer-range pyramidal structures.

3. The optoelectronic device of claim 1, wherein a first portion of the insulating layer comprises at least one of the materials from among silicon oxides, silicon nitrides, and aluminum oxides.

4. The optoelectronic device of claim 1, wherein at least a second portion of the insulating layer comprises at least one material which is not electrically conductive.

5. The optoelectronic device of claim 4, wherein the second part of the insulating layer comprises at least one of the materials selected from the group comprising AlN, Ti, TiN, Ta, TaN, Hf, HfN, W, WN, and Mo.

6. The optoelectronic device of claim 1, wherein each semiconductor element is mainly made of a III-V compound.

7. The optoelectronic device of claim 6, wherein each semiconductor element mainly comprises gallium nitride.

8. A method of manufacturing an optoelectronic device comprising the steps of:
   forming, on a support, an insulating layer at least partially covering the support;
   forming an opening in the insulating layer, wherein:
      the height of the opening is greater than or equal to 200 nm and smaller than or equal to 3,000 nm, wherein the height of the opening is the thickness of the insulating layer at least partially covering the support;
      the ratio of the height to the average diameter of the opening at the top of the insulating layer is greater than or equal to 1 and smaller than or equal to 10; and
      the average diameter of the opening decreases continuously from the top of the opening to the base of the opening; and
   growing in each opening a semiconductor element resting on the support, wherein the semiconductor element completely fills the opening and the semiconductor elements belong to light-emitting diodes.

9. The method of claim 8, wherein the height of the insulating layer is greater than or equal to 100 nm and smaller than or equal to 1,000 nm.

10. An optoelectronic device comprising:
   semiconductor elements belonging to light-emitting diodes, each semiconductor element resting on a support through an opening formed in an insulating layer at least partially covering the support, wherein:
      the height of the opening is greater than or equal to 200 nm and smaller than or equal to 3,000 nm, wherein the height of the opening is the thickness of the insulating layer at least partially covering the support;
      the ratio of the height to the smallest diameter of the opening being greater than or equal to 1 and smaller than or equal to 10; and
      the opening successively comprises, from the base of the opening, a first part and a second part, wherein:
         the average diameter of the first part is constant along the height of the first part;
         the average diameter of the second part is constant along the height of the second part; and
         the average diameter of the first part is different than the average diameter of the second part.

11. The optoelectronic device of claim 10, wherein the semiconductor elements are nanowires, microwires, and/or nanometer- or micrometer-range pyramidal structures.

12. The optoelectronic device of claim 10, wherein the average diameter of the first part is smaller than the average diameter of the second part.

13. The optoelectronic device of claim 10, wherein the average diameter of the first part is greater than the average diameter of the second part.

14. The optoelectronic device of claim 10, wherein a first portion of the insulating layer comprises at least one of the materials from among silicon oxides, silicon nitrides, and aluminum oxides.

15. The optoelectronic device of claim 10, wherein at least a second portion of the insulating layer comprises at least one material which is not electrically conductive.

16. The optoelectronic device of claim 15, wherein the second portion of the insulating layer comprises at least one of the materials selected from the group consisting of AlN, Ti, TiN, Ta, TaN, HfN, W, WN, and Mo.

17. The optoelectronic device of claim 10, wherein each semiconductor element is mainly made of a III-V compound.

18. The optoelectronic device of claim 17, wherein each semiconductor element mainly comprises gallium nitride.

19. A method of manufacturing an optoelectronic device comprising the steps of:
   forming, on a support, an insulating layer at least partially covering the support;
   forming an opening in the insulating layer, wherein:
      the height of the opening is greater than or equal to 200 nm and smaller than or equal to 3,000 nm, wherein the height of the opening is the thickness of the insulating layer at least partially covering the support;
      the ratio of the height to the average diameter of the opening at the top of the insulating layer is greater than or equal to 1 and smaller than or equal to 10; and
      the opening successively comprises, from the base of the opening, a first part and a second part, wherein:
         the average diameter of the first part is constant along the height of the first part;
         the average diameter of the second part is constant along the height of the second part; and
         the average diameter of the first part is different than the average diameter of the second part; and
   growing in each opening a semiconductor element resting on the support, wherein the semiconductor element completely fills the opening and the semiconductor elements belong to light-emitting diodes.

20. The method of claim 19, wherein the height of the insulating layer is greater than or equal to 100 nm and smaller than or equal to 1,000 nm.

21. The method of claim 20, wherein the forming of the insulating layer comprises the steps of:
   depositing a first insulating layer comprising a first insulating material;
   depositing a second insulating layer comprising a second insulating material different from the first insulating material;
   forming the first part of the opening in the first insulating layer; and
   forming the second part of the opening in the second insulating layer.

22. The method of claim 20, wherein the forming of the insulating layer comprises the steps of:

depositing a first insulating layer comprising a first insulating material;
forming the first part of the opening in the first insulating layer;
depositing a second insulating layer comprising a second insulating material different from the first insulating material; and
forming the second part of the opening in the second part of the insulating layer.

* * * * *